(12) United States Patent
Arndt et al.

(10) Patent No.: US 7,427,806 B2
(45) Date of Patent: Sep. 23, 2008

(54) SEMICONDUCTOR COMPONENT EMITTING AND/OR RECEIVING ELECTROMAGNETIC RADIATION, AND HOUSING BASE FOR SUCH A COMPONENT

(75) Inventors: Karlheinz Arndt, Bad Abbach (DE); Georg Bogner, Lappersdorf (DE); Bert Braune, Wenzenbach (DE); Günter Waitl, Regensburg (DE)

(73) Assignee: Oram GmbH, Munich (DE)

( * ) Notice: Subject to any disclaimer, the term of this patent is extended or adjusted under 35 U.S.C. 154(b) by 209 days.

(21) Appl. No.: 11/179,028

(22) Filed: Jul. 18, 2005

(65) Prior Publication Data

US 2006/0022215 A1   Feb. 2, 2006

(51) Int. Cl.
*H01L 23/20* (2006.01)
(52) U.S. Cl. .................. 257/682; 257/433; 257/685; 257/730; 257/787
(58) Field of Classification Search .................. None
See application file for complete search history.

(56) References Cited

U.S. PATENT DOCUMENTS

| | | |
|---|---|---|
| 4,727,457 A | 2/1988 | Thillays |
| 5,040,868 A | 8/1991 | Waitl et al. |
| 5,043,716 A | 8/1991 | Latz et al. |
| 5,331,512 A | 7/1994 | Orton |
| 5,545,359 A | 8/1996 | Ackley et al. |
| 5,614,131 A | 3/1997 | Mukerji et al. |
| 5,686,172 A | 11/1997 | Ohya et al. |
| 5,821,615 A | 10/1998 | Lee ............................. 257/686 |
| 6,052,500 A | 4/2000 | Takano et al. |
| 6,066,861 A | 5/2000 | Hohn et al. .................... 257/99 |
| 6,103,398 A | 8/2000 | Norton et al. |
| 6,274,924 B1 | 8/2001 | Carey et al. .................. 257/676 |

(Continued)

FOREIGN PATENT DOCUMENTS

DE   100 20 465   11/2001

(Continued)

OTHER PUBLICATIONS

Frank Möllmer et al., "Siemens-SMT-TOP-LED-LEDs for Surface Mounting", *Siemens Components XXVI*, No. 4-5, pp. 147-149 (1991).

*Primary Examiner*—Wai-Sing Louie
(74) *Attorney, Agent, or Firm*—Fish & Richardson P.C.

(57) ABSTRACT

Disclosed is a radiation emitting and/or receiving semiconductor component comprising at least one radiation emitting and/or receiving semiconductor chip (1), which is disposed in a recess (2) of a housing base body (3) and is there encapsulated with an encapsulant (4) that is readily transparent to electromagnetic radiation emitted and/or received by the semiconductor chip (1). The recess (2) comprises a chip well (21) in which the semiconductor chip (1) is secured, and a trench (22) that runs at least partway around the chip well (21) inside the recess (2), such that between the chip well (21) and the trench (22) the housing base body (3) comprises a wall (23) whose apex, viewed from a bottom face of the chip well (21), lies below the level of the surface of the housing base body (3) from which the recess (2) leads into the housing base body (3), and the encapsulant (4) extends outward from the chip well (21) over the wall into the trench (22). A corresponding housing base body is also disclosed.

20 Claims, 3 Drawing Sheets

U.S. PATENT DOCUMENTS

| | | | |
|---|---|---|---|
| RE37,554 E | 2/2002 | Brunner et al. | |
| 6,440,877 B1 | 8/2002 | Yamazaki et al. | |
| 6,610,563 B1 | 8/2003 | Waitl et al. | |
| 6,624,491 B2 | 9/2003 | Waitl et al. | |
| 6,669,866 B1 | 12/2003 | Kummer et al. | 252/301.4 R |
| 6,897,490 B2 | 5/2005 | Brunner et al. | 257/98 |
| 6,943,433 B2 * | 9/2005 | Kamada | 257/666 |
| 6,946,714 B2 * | 9/2005 | Waitl et al. | 257/434 |
| 2002/0161669 A1 | 10/2002 | Kitahara et al. | 705/26 |
| 2004/0065894 A1 | 4/2004 | Hashimoto et al. | 257/100 |

FOREIGN PATENT DOCUMENTS

| | | |
|---|---|---|
| DE | 101 22 002 | 11/2002 |
| EP | 0 230 336 | 7/1987 |
| EP | 0 374 121 | 6/1990 |
| EP | 0 400 176 | 12/1990 |
| EP | 1 249 783 | 10/2002 |
| JP | 57-085273 | 5/1982 |
| JP | 60-020587 | 2/1985 |
| JP | 02-10606 | 1/1990 |
| JP | 08032120 | 2/1996 |
| JP | 09-027643 | 1/1997 |
| JP | 09027643 | 1/1997 |
| JP | 9-83018 | 3/1997 |
| JP | 2002-049383 | 2/2000 |
| JP | 2004-003886 * | 8/2004 |
| WO | WO82/04500 | 12/1982 |
| WO | WO83/00408 | 2/1983 |
| WO | WO98/12757 | 3/1998 |
| WO | WO 01/06546 | 1/2001 |
| WO | WO 01/08452 | 2/2001 |
| WO | WO 01/82385 | 11/2001 |
| WO | WO 02/091478 | 11/2002 |
| WO | WO 03/019679 | 3/2003 |

* cited by examiner

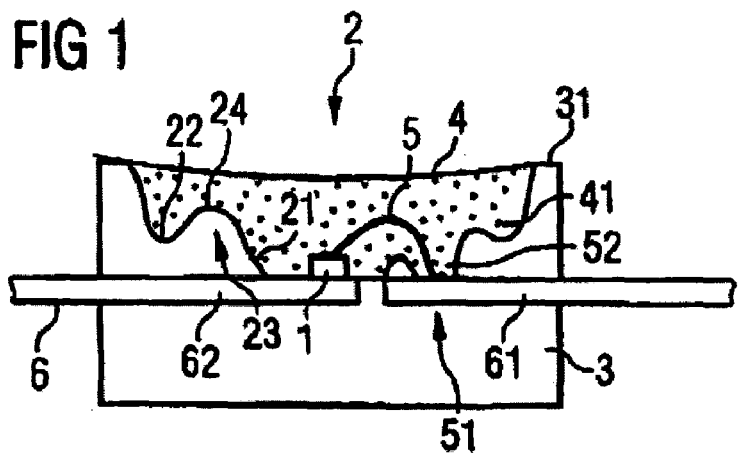
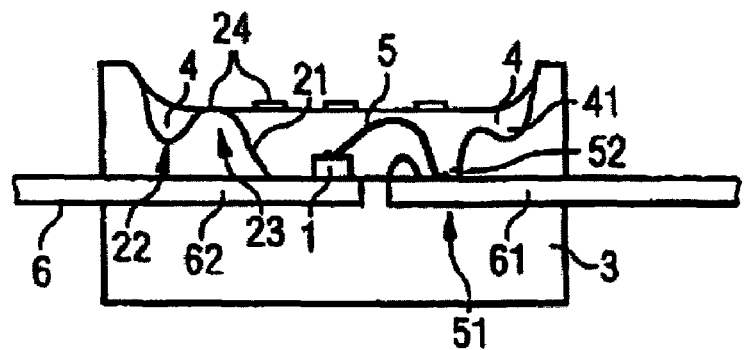
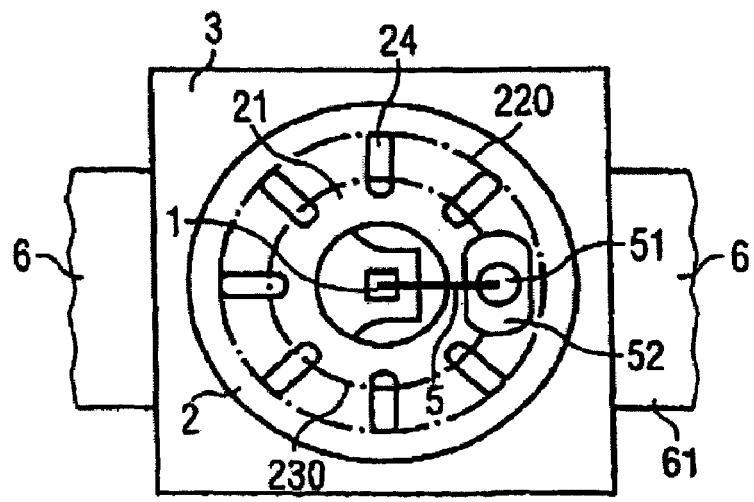

SEMICONDUCTOR COMPONENT EMITTING AND/OR RECEIVING ELECTROMAGNETIC RADIATION, AND HOUSING BASE FOR SUCH A COMPONENT

CROSS REFERENCE TO RELATED APPLICATIONS

Pursuant to 35 U.S.C. §§ 120 and 363, this application claims the benefit of International Patent Application No. PCT/DE2004/000136, which designated the United States and was filed Jan. 29, 2004; the International Patent Application in turn claims priority to German Application No. 103 03 727.6, filed Jan. 30, 2003. The contents of said prior applications are incorporated herein by reference in their entirety

TECHNICAL FIELD

The invention relates to an electromagnetic radiation emitting and/or receiving semiconductor component.

BACKGROUND

Electromagnetic radiation emitting and/or receiving semiconductor component (for example, light-emitting diodes (LEDs)) have many useful applications. One such component is a surface-mountable optoelectronic component, for example, leadframe-based, in which the semiconductor chip is arranged in a recess of a housing base body and secured there. In some cases, the housing base body is preferably prefabricated before the semiconductor chip is mounted in the recess and an encapsulant is used to secure the chip in the recess. Such semiconductor components are known, for example, from *Siemens Components* 29 (1991), Vol. 4, pp. 147 to 149. The encapsulant is conventionally, for example, an epoxy-resin-based potting material. However, such potting materials are often susceptible to UV radiation.

To improve the UV resistance of radiation emitting and/or radiation receiving optoelectronic semiconductor components, the use of silicone resin encapsulants has been proposed. These, however, pose the problem of not bonding as firmly as, for example, epoxy resin to the materials conventionally used for the housing base body. Thus, when silicone resin is used as the encapsulant, there is an increased risk that mechanical or thermal stress between the housing base body and the encapsulant will lead to delamination, beginning at the top edge of the recess and propagating on into it. This results in light loss, due to additional reflective surfaces in the region of the delamination. In the worst case, it can also bring about complete separation of the chip envelope from the housing base body.

SUMMARY

One of objects underlying this disclosure is to provide a semiconductor component of the above-stated kind, particularly a surface-mountable semiconductor component of the above-stated kind, with which the risk of delamination between the encapsulant and the housing base body is reduced despite the use of an encapsulant whose bond to the housing base body is highly susceptible to mechanical stress.

In one aspect, we disclose a semiconductor component and a housing base body in which the recess comprises a chip well in which the semiconductor chip is secured and the chip well is surrounded inside the recess at least partially, that is, over a portion of the circumference of the chip well, by a trench. A wall of the housing base body is accordingly formed between the chip well and the trench. The apex of the wall, viewed from a bottom face of the chip wall, lies entirely below the level of the front side of the housing base body. Said front side is the outer surface of the housing base body from which the recess penetrates into the housing base body, i.e., is the side of the component through which the electromagnetic radiation is emitted and/or received.

In some embodiments of the semiconductor component, the encapsulant is filled into the recess in such a way that it extends outward from the chip well over the wall into the trench. In the trench, an at least partially circumferential, preferably continuous anchoring or sealing strip, particularly an anchoring or sealing ring, is formed of encapsulating material as one piece with the rest of the encapsulant. The encapsulant is preferably silicone-based and has a gel-like consistency.

In a particularly advantageous and therefore particularly preferred embodiment of the component and the housing base body, implemented on the wall is at least one anchoring element, preferably a formed-on lug or rib on the housing base body, or a groove.

When plural anchoring elements are present, they are preferably distributed uniformly—i.e., at substantially equal distances from each other—on the wall over its length. In a particular embodiment, the anchoring elements are arranged in statistically or exactly opposite pairs. The encapsulant preferably spans the anchoring element(s). The fill level inside the recess is in particular high enough so that the encapsulant completely covers the wall and any anchoring elements. This simplifies further processing of the component with conventional pick and place devices.

In another embodiment of the component and the housing base body, respectively, the encapsulant is laid around the anchoring element(s) in a loop-like manner such that the anchoring element(s) protrude(s) at least partially from the encapsulant.

The encapsulant particularly preferably forms in the trench a continuous anchoring ring around the chip well that can additionally have a sealing function.

In a particular embodiment of the component and the housing base body, respectively, the chip well is implemented as a reflector well for the radiation emitted and/or received by the semiconductor chip.

In a particularly preferred embodiment of the component and the housing base body, respectively, the housing base body is prefabricated on a metal leadframe by injection or pressing.

The encapsulant can be admixed in a simple manner with at least one phosphor material that absorbs a portion of the radiation emitted by the semiconductor chip and emits radiation of an altered wavelength compared to the absorbed radiation. LED components that emit mixed-color light or color-matched light can be produced simply in this way.

In a preferred improvement of the component and the housing base body, respectively, the wall has at least one cutout through which at least one chip connection wire is led from the semiconductor chip to a wire connection region of an electrical lead of the component.

With a component according to the invention, it is, advantageously, not necessary for reliable operation that the encapsulant be protected on the housing base body for example by means of a lens-like cover of the kind described in U.S. Pat. No. 6,274,924 or by another covering means.

Further advantages and advantageous improvements of the component and the housing base body will emerge from the following exemplary embodiments described with reference to FIGS. 1 to 7.

DESCRIPTION OF DRAWINGS

FIG. 1 is a schematic illustration of a sectional view through a first exemplary embodiment of an inventive component, FIG. 2 is a schematic illustration of a sectional view through a second exemplary embodiment of an inventive component, FIG. 3 is a schematic illustration of a plan view of the housing base body according to the first and second exemplary embodiments.

In the figures, like or like-acting elements of the exemplary embodiments are respectively identified in the same manner and provided with the same reference numerals. The figures are basically not to be construed as to-scale representations of real devices according to the invention.

DETAILED DESCRIPTION

Figure 4:
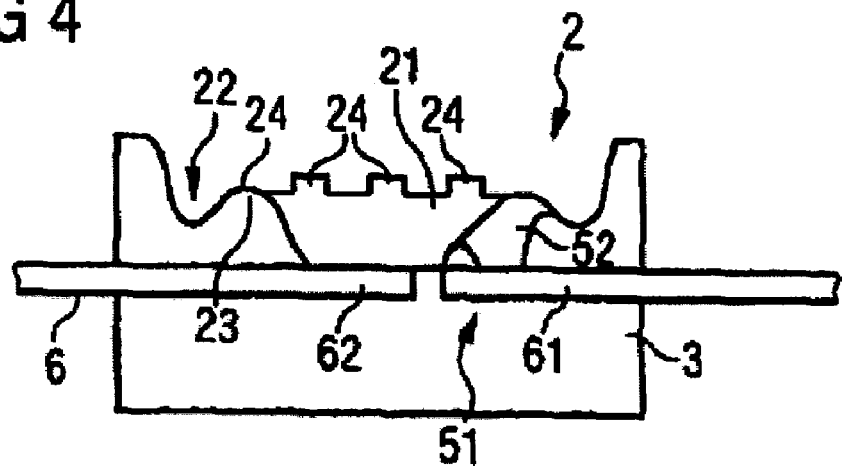
FIG. 4 is a schematic illustration of a sectional view of the housing base body according to the first and second exemplary embodiments.

The component illustrated schematically in FIG. 1 is a surface-mountable LED component comprising an LED chip 1 that may emit UV radiation, inter alia, for example a GaN-based, visible-blue-light-emitting LED chip that designedly or unintentionally emits UV radiation as well. Such components are also suitable in principle for use in other types of LED chips, as well as in IR-emitting components intended in particular for high-temperature applications.

The LED chip 1 is mounted on an electrical chip connector of a metal leadframe 6 and connected via a bond wire 5 to a wire connection region 51 of an electrical wire connector 61 of the leadframe 6 that is electrically isolated from the chip connector 62.

Disposed on the leadframe is a housing base body 3 that comprises a recess 2 and is, for example, injection-molded or press-molded of synthetic material. Recess 2 comprises a chip well 21 in which the LED chip 1 is disposed. Around chip well 21, which in the present case is implemented as a reflector well for electromagnetic radiation emitted by LED chip 1, there runs a trench 22 (indicated in FIG. 3 by broken line 220), causing a wall 23 (indicated in FIG. 3 by broken line 230) to be formed between chip well 21 and this trench 22.

Wall 23 has at one location a cutout 52 that extends to wire connection region 51 and through which the bond wire 5 is run to wire connection region 51.

Implemented on wall 23 is a plurality of anchoring elements 24 in the form of lugs or ribs, which are distributed on wall 23 for example evenly around chip well 21 except in the region where the recess for bond wire 5 is located. Said anchoring elements 24 begin at the upper end of wall 23 and project only partially into trench 22, so that when viewed from chip well 21, trench 22 is continuously circumferential behind anchoring elements 24.

Viewed from the bottom of chip well 21, the apex of wall 23, including anchoring elements 24, lies below the height of the front side 31 of housing base body 3 over the entire length of the wall 23.

Figure 5:
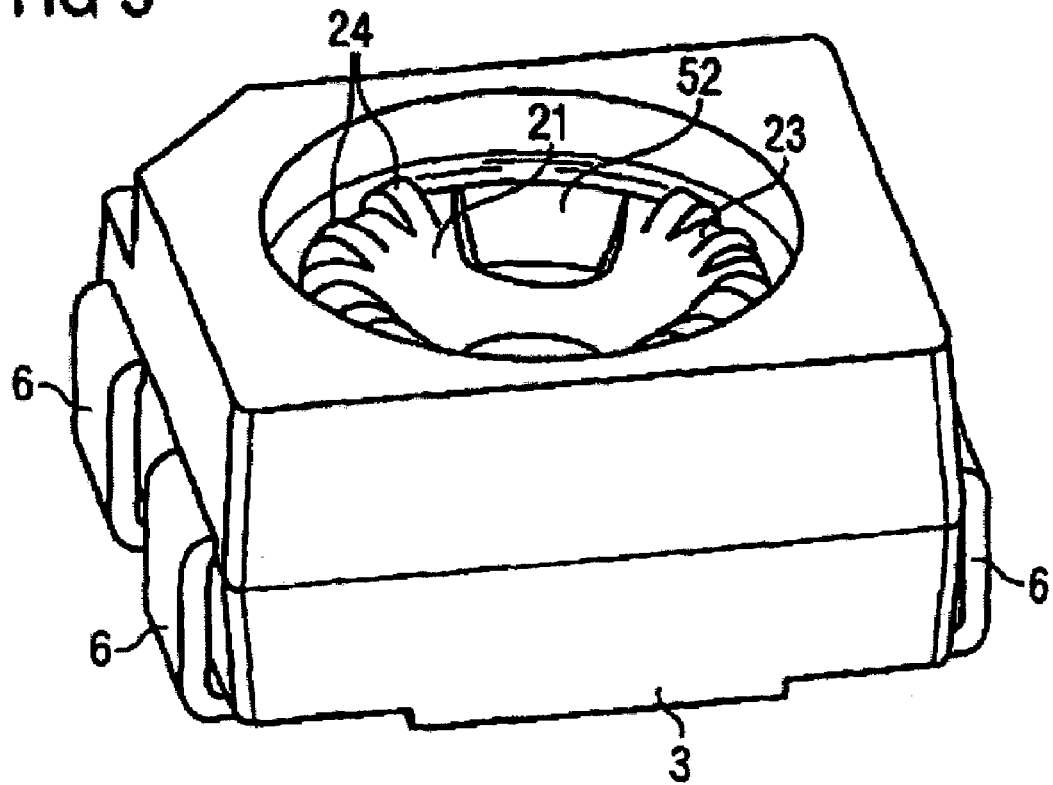
FIG. 5 is a schematic illustration of a perspective view of a housing base body according to the first and second exemplary embodiments, for example intended for a surface-mountable light-emitting diode (LED) component or infrared-emitting diode (IRED) component.

As is apparent from FIGS. 3 to 5, housing base body 3, wall 23 and anchoring elements 24 are preferably formed in one piece in a single injection molding or press molding operation.

Located in recess 2 is an encapsulant 4 composed of a radioparent, for example clear, gel-like, silicone-based potting material, which is admixed with a phosphor powder 7, for example a YAG:Ce-, TbAG:Ce- or TbYAG:Ce-based phosphor. Such phosphors are known, for example, from WO 98/12757 and WO 01/08452, whose disclosure content in this respect is hereby incorporated by reference. The encapsulant 4 in recess 2 fills chip well 21, spreads over wall 23 and anchoring elements 24, and, viewed from chip well 21 outward, forms behind wall 23, in this case therefore in trench 22, an anchoring ring 41 that can additionally assume a sealing function. The encapsulant 4 has a concave free surface on its side facing away from the LED chip 1.

In components that are designed to emit only the original radiation from the LED chip, the encapsulant 4 can be solely a clear, gel-like, silicone-based potting material. Alternatively, the material can be provided with diffuser particles and thus rendered turbid.

The second exemplary embodiment, depicted in FIG. 2, differs from the exemplary embodiment described above in connection with FIG. 1 particularly in that the recess 2 is not filled with encapsulant 4 to such a high level that the anchoring elements are completely covered with it, but the anchoring elements 24 instead penetrate the encapsulant 4. The encapsulant 4 thus is laid around the anchoring elements 24 in a loop-like manner. This exemplary embodiment provides, for example, a clear, silicone-based encapsulant 4 containing no phosphor. Such an encapsulant can also, of course, be used in the other exemplary embodiments.

Figure 6:
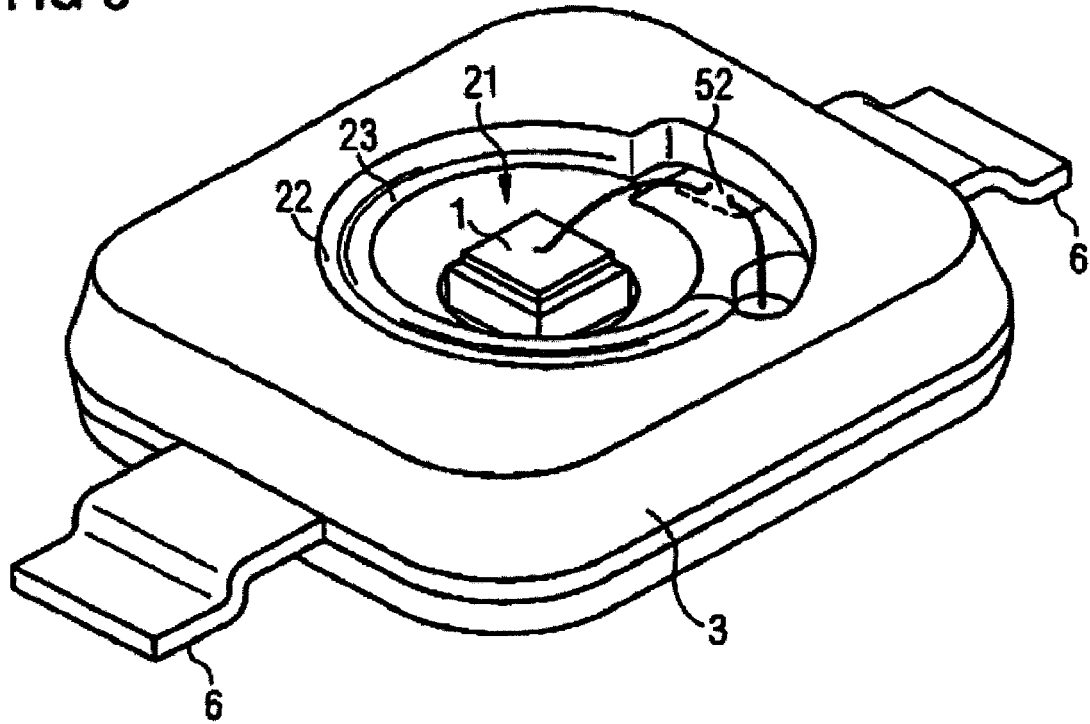
FIG. 6 is a schematic illustration of a perspective view of a housing base body according to a third exemplary embodiment, for example intended for a surface-mountable light-emitting diode (LED) component or infrared-emitting diode (IRED) component.
Figure 7:
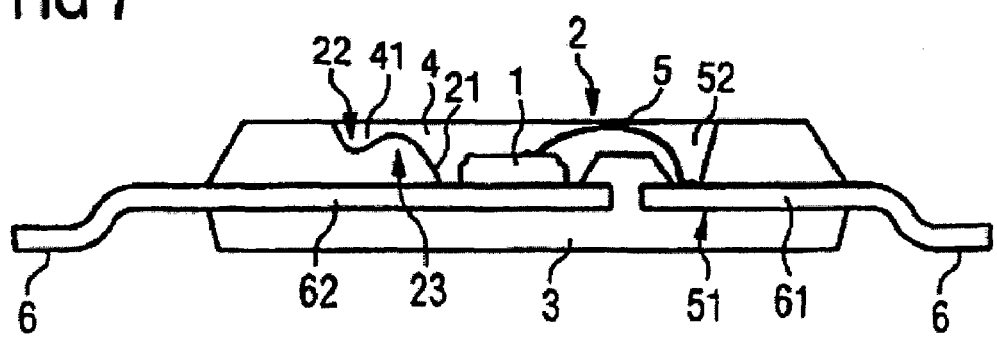
FIG. 7 is a schematic illustration of a sectional view of the housing base body according to the third exemplary embodiment.

The third exemplary embodiment, depicted schematically in FIGS. 6 and 7, differs from the exemplary embodiment described above in connection with FIG. 1 particularly in that there are no anchoring elements on the wall 23.

Housing base bodies and encapsulants corresponding to the exemplary embodiments can also be used for radiation-receiving semiconductor chips, such as photodiode chips. The photodiode chip can then take the place of LED chip 1. The inventive design is equally well suited for use in laser diode components, detector components, and high-temperature applications.

The explanation of the inventive technical teaching with reference to the exemplary embodiments is naturally not to be construed as limitative of the invention. Rather, the technical teaching of the invention is utilized, for example, by all components and housing base bodies comprising a chip well and a trench that runs at least partway around the chip well and in which the encapsulant spreads outward from the chip well to reduce the risk of delamination between the chip encapsulant and the housing base body.

The features of the invention disclosed in the foregoing description, in the drawing and in the claims can be essential to the realization of the invention both individually and in any combination. The invention encompasses any novel feature and any combination of features, including in particular any combination of individual features recited in the claims, even if that combination itself is not mentioned explicitly in the claims.

What is claimed is:

1. A housing base body, for a radiation emitting and/or receiving semiconductor component comprising at least one radiation emitting and/or receiving semiconductor chip and a recess for said semiconductor chip in which said semiconductor chip can be encapsulated by means of an encapsulant,
wherein said recess comprises a chip well in which said semiconductor chip is secured, and a trench that runs inside said recess at least partway around said chip well, such that between said chip well and said trench said housing base body comprises a wall whose apex, viewed from a bottom face of said chip well, lies below the level of the surface of said housing base body from which said recess leads into said housing base body.

2. The housing base body as recited in claim 1, wherein at least one anchoring element is implemented on said wall.

3. The housing base body as recited in claim 1, wherein disposed on said wall are plural anchoring elements that are distributed along the edge of said chip well, particularly at equal distances from each other along the edge of said chip well.

4. The housing base body as recited in claim 1, wherein said trench, viewed from said chip well outward, is continuous behind said anchoring elements, in such a way that an encapsulant can form in said trench a continuous anchoring or sealing strip, particularly a continuous anchoring or sealing ring, around said chip well.

5. The housing base body as recited in claim 1, wherein said chip well is implemented as a reflector well for the radiation emitted and/or received by said semiconductor chip.

6. The housing base body as recited in claim 1, wherein said housing base body is prefabricated on a metal leadframe by injection or pressing.

7. The housing base body as recited in claim 1, wherein said wall comprises at least one cutout through which at least one chip connection wire can be run from a semiconductor chip to a wire connection region of an electrical lead of said component.

8. A radiation emitting and/or receiving semiconductor component comprising:
a housing base body according to claim 1;
one or more radiation emitting and/or receiving semiconductor chips disposed in the recess of said housing base body; and
an encapsulating element covering said one or more semiconductor chips, the encapsulant element being transparent to electromagnetic radiation emitted and/or received by said one or more semiconductor chips;
wherein said encapsulant element is formed as a single piece extending from said chip well outward over said well into said trench.

9. The semiconductor component as recited in claim 8, wherein said encapsulant element comprises silicone.

10. The semiconductor component as recited in claim 8, wherein said encapsulant element has a gel-like consistency.

11. The semiconductor component as recited in claim 8, wherein said wall includes at least one anchoring element that projects into said encapsulant.

12. The semiconductor component as recited in claim 11, wherein plural anchoring elements are disposed on said wall, the plural anchoring elements being distributed evenly around said chip well on said wall, and projecting from said wall into said encapsulant element.

13. The semiconductor component as recited in claim 11, wherein said anchoring element includes an anchoring lug or an anchoring rib projecting from said wall, and said encapsulant element is disposed in a loop-like manner around said anchoring element such that said anchoring element protrudes at least partially from said encapsulant.

14. The semiconductor component as recited in claim 11, wherein said anchoring element includes an anchoring lug or an anchoring rib projecting from said wall, said encapsulant element spanning said anchoring element.

15. The semiconductor component as recited in claim 8, wherein said encapsulant forms in said trench a continuous anchoring ring and/or sealing ring around said chip well.

16. The semiconductor component as recited in claim 8, wherein said chip well is configured as a reflector well to reflect the radiation emitted and/or received by said one or more semiconductor chips.

17. The semiconductor component as recited in claim 8, wherein said housing base body is prefabricated on a metal leadframe in one piece from a molding compound.

18. The semiconductor component as recited in claim 8, wherein said encapsulant element includes at least one phosphor material admixed into said encapsulant element, said at least one phosphor material configured to absorb a portion of the radiation emitted by said semiconductor ship and emit radiation having an altered wavelength that is different from an associated wavelength of the absorbed radiation.

19. The semiconductor component as recited in claim 8, wherein said wall comprises at least one cutout through which at least one chip connection wire is run from said one or more semiconductor chips to a wire connection region of an electrical lead of said component.

20. The semiconductor component as recited in claim 8, wherein said one or more semiconductor chips are configured to emit UV radiation.

* * * * *

UNITED STATES PATENT AND TRADEMARK OFFICE
CERTIFICATE OF CORRECTION

PATENT NO. : 7,427,806 B2 Page 1 of 1
APPLICATION NO. : 11/179028
DATED : September 23, 2008
INVENTOR(S) : Karlheinz Arndt et al.

It is certified that error appears in the above-identified patent and that said Letters Patent is hereby corrected as shown below:

Title page, item [73] "ASSIGNEE", column 1, delete "Oram" and insert --Osram--.

In Claim 18, at column 6, line 39, delete "ship" and insert --chip--.

Signed and Sealed this

Twentieth Day of January, 2009

JON W. DUDAS
*Director of the United States Patent and Trademark Office*